United States Patent [19]

Hori et al.

[11] Patent Number: 5,270,226

[45] Date of Patent: Dec. 14, 1993

[54] MANUFACTURING METHOD FOR LDDFETS USING OBLIQUE ION IMPLANTION TECHNIQUE

[75] Inventors: Takashi Hori, Takatsuki; Toshiki Yabu, Moriguchi; Kazumi Kurimoto, Osaka; Genshu Fuse, Hirakata, all of Japan

[73] Assignee: Matsushita Electric Industrial Co., Ltd., Osaka, Japan

[21] Appl. No.: 332,714

[22] Filed: Apr. 3, 1989

[51] Int. Cl.⁵ ............................................. H01L 21/336
[52] U.S. Cl. ........................................ 437/35; 437/41; 437/44
[58] Field of Search .................. 437/29, 35, 44, 41

[56] References Cited

U.S. PATENT DOCUMENTS

| | | | |
|---|---|---|---|
| 3,841,917 | 10/1974 | Shannon | 437/35 |
| 3,967,365 | 7/1976 | Friedrich | 437/35 |
| 4,232,439 | 11/1980 | Shibata | 437/35 |
| 4,280,854 | 7/1981 | Shibata et al. | 437/35 |
| 4,404,233 | 9/1983 | Ikeda et al. | 437/35 |
| 4,417,385 | 11/1983 | Temple | 437/35 |
| 4,680,603 | 7/1987 | Wei et al. | 357/23.3 |
| 4,771,012 | 9/1988 | Yabu et al. | 437/35 |
| 4,837,173 | 6/1989 | Alvis et al. | 437/44 |
| 4,889,820 | 12/1989 | Mori | 437/29 |
| 4,918,027 | 4/1990 | Fuse et al. | 437/35 |
| 4,921,812 | 5/1990 | Nagai | 437/35 |
| 4,950,617 | 8/1990 | Kumagai et al. | 547/44 |

FOREIGN PATENT DOCUMENTS

| | | | |
|---|---|---|---|
| 0072585 | 6/1977 | Japan | 437/44 |
| 0073975 | 5/1982 | Japan | 437/35 |
| 0093279 | 6/1983 | Japan | 437/44 |
| 0061185 | 4/1984 | Japan | 437/35 |
| 0119870 | 7/1984 | Japan | 437/44 |
| 0144175 | 8/1984 | Japan | 437/35 |
| 61-258475 | 11/1986 | Japan . | |
| 0113474 | 5/1987 | Japan | 437/35 |
| 0274714 | 11/1987 | Japan | 437/4 |
| 62-293773 | 12/1987 | Japan . | |
| 62-293776 | 12/1987 | Japan . | |
| 0041019 | 2/1988 | Japan . | |
| 0095669 | 3/1988 | Japan . | |
| 0215075 | 9/1988 | Japan . | |
| 0233567 | 9/1988 | Japan . | |
| 0245921 | 10/1988 | Japan | 437/35 |
| 0021919 | 1/1989 | Japan | 437/35 |

OTHER PUBLICATIONS

Tsang et al., "Fabrication of High-Performance LDDFET's With Oxide Sidewall-Spacer Technology", IEEE Trans. on Electron Devices, vol. ED-29, No. 4, Apr. 1982, pp. 590–596.

"A New Half-Micron p-Channel Mosfet with Latips"; Takashi Hori and Kazumi Kurimoto; IEDM Dec. 11–14, 1988; pp. 394–397.

"A New Submicron MOSFET with LATID Structure"; Takashi Hori, Kazumi Kurimoto, Toshiki Yabu, and Genshu Fuse; pp. 15 and 16, VLSI Symp. Dig., May 1988.

*Primary Examiner*—Mary Wilczewski
*Attorney, Agent, or Firm*—Wenderoth, Lind & Ponack

[57] ABSTRACT

By symmetrically forming source and drain regions to the gate electrodes, electrically symmetrical transistor characteristics are obtained. After forming the first source and drain regions by large-tilt-angle ion implantation, without a sidewall in the gate electrode or after forming a sidewall shorter than the distance in the lateral direction of the second source and drain regions from the end of the mask for ion implantation, the diffusion of the second source and drain regions in the lateral direction is restricted to the maximum extent by heat treatment for a short time, and then the end of the gate electrode and the end of the second source and drain regions are matched, or their overlap region is formed. As a result, the manufacturing method of the MOS transistor results in both high performance and high reliability.

13 Claims, 12 Drawing Sheets

MANUFACTURING METHOD FOR LDDFETS USING OBLIQUE ION IMPLANTION TECHNIQUE

BACKGROUND OF THE INVENTION

This invention relates to a method of manufacturing a MOS transistor by large-tilt-angle ion implantation.

In the conventional a method of manufacturing a MOS transistor in particular, an n-channel MOS transistor in order to obtain a highly reliable drain-sustaining voltage, after forming a gate electrode, a low concentration of ions are implanted using the gate electrode as a mask to form first source and drain regions, and a sidewall is formed on each side of the gate electrode of an insulating film, and a high concentration of ions are implanted using the gate electrode and sidewall as a mask to form second source and drain regions, thereby forming a MOS transistor having an LDD (lightly doped drain) structure (e.g. IEEE Transactions on Electron Devices, Vol. ED-29, No. 4, April 1982).

As an example of such process, a manufacturing method of an n-channel LDD structure MOS transistor described below while referring to FIG. 1. First, after isolating elements on a P-type semiconductor substrate 1, a gate insulator film 2 is formed, and a polysilicon film is deposited and etched to form a gate electrode 3 [FIG. 1 (a)]. Next, in order to form LDD regions (n− layer) 4s, 4d, ions of a low concentration A (using phosphorus in this case) are implanted, using the gate electrode 3 as a mask [FIG. 1 (b)]. Afterwards, a CVD-SiO2 film 6 is formed [FIG. 1 (c)], and by anisotropic etching of the CVD-SiO2 film 6, the CVD-SiO2 film 6 formed on the flat surface is removed, and a sidewall 7 made of the CVD-SiO2 film 6 is obtained on the periphery of the gate electrode 3 [FIG. 1 (d)]. Next, in order to form the desired source and drain regions (n+ layer) 5s, 5d, ions of a high concentration B (using arsenic) are implanted using both of the gate electrode 3 and sidewalls 7 as a mask [FIG. 1 (e)]. At this time, the sidewall 7 CVD-SiO2 film 6 impedes the ion implantation into the surface of the semiconductor substrate 1, and the LDD regions (n− layer) 4s, 4d remain between the source and drain regions (n+ layer) 5s, 5d. Finally, by heat treatment, an n-channel LDD structure MOS transistor is formed as shown in FIG. 1 (e).

Thus, in the conventional LDD structure MOS transistor, the LDD regions (n− layer) 4s, 4d operate lessen the drain electric field, and a high reliability is obtained in the brain-sustaining Voltage, etc.

In the conventional LDD structure MOS transistors, however, as shown in FIG. 1 (e), since the majority of the LDD region (n− layer) 4s, 4d is generally located outside, not immediately beneath the gate electrode 3, the LDD region located outside the gate electrode 3 is pinched off, which tends to be a high resistance layer. Accordingly, as compared with the conventional single source/drain structure MOS transistor, the LDD structure MOS transistor has the following disadvantages.

(1) Since the high resistance layer intervenes in series, the driving current drops. Particularly in a high gate-drive voltage.

(2) As hot electrons are injected into the sidewall 7, the n− layers 4s, 4d immediately beneath the sidewall 7 are pinched off, and are extremely increase in resistance. Accordingly, as compared with the conventional single source/drain structure MOS transistor, deterioration of the driving current due to hot electrons takes place earlier, which is a serious reliability problem.

On the other hand, in a p-channel MOS transistor using an n+ poly-Si gate, a buried channel structure of the same conductive type as the source and drain regions is employed. In such a buried-channel transistor, however, as the channel length becomes shorter, a short-channel effect tends to occur, and the source and drain regions are short-circuited (punchthrough phenomenon), which causes serious trouble. In addition to this buried channel structure, when P+ source and drain regions are formed by an ordinary boron (B), the diffusion coefficient of boron is large, and penetration in the lateral direction from the gate end and the junction depth of the source and drain both become large, which is another cause of punchthrough.

Accordingly, in order to cope with such problems, as disclosed in the Japanese Patent Publication No. 61-160976, a p channel MOS transistor is constructed by using an effective punchthrough stopper (EPS) as shown in FIG. 2. That is, by disposing a sidewall, the overlap length of the gate electrode end and p+ source and drain region is minimized, and an EPS region (n+ region) is provided in the vicinity thereof.

As an example of such a process, a manufacturing method of a p-channel EPS structure MOS transistor is explained while referring to 2. First, after the element isolation process of the n-type semiconductor substrate or n-well 8, a p-type buried channel 9 is formed. Afterwards, by forming a gate insulator film 2, a polysilicon film is deposited, and is etched to form a gate electrode 3 [FIG. 2 (a)]. Next, in order to form EPS regions (n+ layers) 10s, 10d, a low concentration of ions A (phosphorus) are implanted using the gate electrode 3 as mask [FIG. 2 (b)]. Later, the CVD-SiO2 film is formed [FIG. 2 (c)], and anisotropically etched. The CVD-SiO2 film 6 formed on the flat surface is removed, and a sidewall 7 of CVD-SiO2 film 6 is formed on the periphery of the gate electrode 3 [FIG. 2 (d)]. Then, in order to form the desired source and drain regions (p+ layers) 11s, 11d, a high concentration of ions B(BF2 or B) are implanted using the gate electrode 3 and sidewall 7 as a mask [FIG. 2 (e)]. At this time, the sidewall 7 impedes the ion implantation onto the semiconductor surface, and source and drain regions (p+ layers) 11s, 11d, and EPS regions (n+ layers) 10s, 10d are formed. Finally, by heat treatment, a p-channel EPS structure MOS transistor is formed as shown in FIG. 2 (e).

Thus, in the conventional EPS structure MOS transistor, by building up a structure possessing EPS regions, the EPS regions (n+ layers) 10s, 10d operate to inhibit the elongation of potential from the drain region 11d by the drain voltage, which is effective to suppress the short channel effect and punchthrough phenomenon.

However, the ion implantation A is close to the vertical direction (usually inclining 7° to prevent channeling), and penetration of EPS regions 10s, 10d from the end of gate electrode 3 is small. The EPS regions 10s, 10d are likely to diminish by the diffusion in the lateral direction of the source and dram regions 11s, 11d due to the subsequent high concentration ion implantation B and heat treatment. In order to avoid this, it is indispensable to form a relatively thick sidewall 7 of about 0.25 μm. Accordingly, the source and drain regions 11s, 11d are nearly matched with the gate electrode 3 end by self-aligning of the high concentration ion implantation B by the gate electrode 3 with using the sidewall 7, the EPS structure MOS transistor has the following demerits as compared with the conventional single source/drain structure MOS transistor.

(1) For control of the diffusion in the lateral direction of the source and drain regions $11s$, $11d$ after high treatment or the width of sidewall 7, certain fluctuations occur in the process, and the ends of the source and drain regions $11s$, $11d$ may come outside the gate electrode 3, not matching at all. In such cases, a channel region is also formed just outside the gate electrode 3, and the gate controllability in the channel region in this area is lowered significantly to cause pinchoff, resulting in a resistance increase. In consequence, the driving current is lowered, and a high electric field is formed in this portion, and therefore the deterioration due to hot carriers becomes a more serious problem than in the conventional single source/drain structure, (2) Comparing the width of gate electrode 3, the effective channel length of the EPS structure MOS transistor in FIG. 4 is longer by the portion of the double width of the sidewall 7, and accordingly the driving current is lowered.

Furthermore, the LDD structure MOS transistor in FIG. 1 and the EPS structure MOS transistor in FIG. 4 possess the following problems as compared with the conventional single source/drain structure MOS transistor. That is, in the step of forming the source and drain regions, in order to avoid the channeling effect of impurities when implanting ions, ions are implanted at a certain inclination angle (generally about 7°) relative to the vertical direction of the semiconductor surface. Accordingly, when ions were implanted from the drain (or source) region side to the gate electrode, the portion adjacent to the gate electrode in the source (or drain) region on the opposite side came under the shadow, impurities were not implanted, the transistor structure became asymmetric, and an asymmetry occurred in the transistor characteristic depending on the direction of the source or drain. Such a problem of asymmetricity may be mostly ignored in a high concentration layer such as the source and drain desired in the structure, but it is known to be serious 4-n the case of LDD regions (n− layers) $4s$, $4d$ in FIG. 1, or EPS regions (n+ layers) $10s$, $10d$ in FIG. 4. To solve the problem of asymmetry, U.S. Pat. No. 4,771,012, one of the authors of which is an inventor of this invention, has proposed a method of fabricating a MOS transistor by repeating ion implation steps by rotating the semiconductor substrate in planarity.

SUMMARY OF THE INVENTION

The manufacturing method of an MOS transistor of the invention includes a step of forming a gate electrode on a gate insulator film formed to become an MOS transistor region on the semiconductor substrate surface, a step of forming first source and drain regions by implanting ions into the semiconductor substrate surface from both directions by inclining so as to enter vertically in the channel widthwise direction and into the source and drain in the channel lengthwise direction using the gate electrode as mask, and a step of forming second source and drain regions differing in the ion implantation angle and implantation dose in the same manner as in the first source and drain regions. In the steps of forming first and second source and d in regions, the semiconductor substrate is rotated on a plane with respect to the beam scanning surface by inclining at an angle of the semiconductor substrate surface and the plane perpendicular to the ion beam, or the angle of the semiconductor substrate surface and the plane perpendicular to the ion beam is inclined, and the rotation angle of the semiconductor substrate at every time in a total of n ion unplantations is set at an integer multiple of about 360 degrees/n.

Consequently, the first low-concentration source and drain regions are formed entirely beneath the gate electrode, and so, pinch-off of the region is avoided resulting in high current drivability and high realiability.

Furthermore, the manufacturing method of MOS transistor of this invention includes a step of an forming a channel region of a second conductive type in a portion to be a MOS transistor region selectively formed on a semiconductor substrate of a first conductive type, a step of forming a gate electrode on a gate insulator film formed in the portion to be a MOS transistor region on the semiconductor substrate surface possessing the channel region, a step of forming a high concentration impurity layer of the first conductive type so as to contain part of the lower part of the channel region by implanting ions by inclining the semiconductor substrate surface using the gate electrode as mask, and a step of forming source and drain regions of the second conductive type differing in the ion implantation angle and implantation dose in the same manner as in the impurity layer of the first conductive layer. In the steps of forming the impurity layer of the first conductive type and the source and drain regions of the second conductive type, the semiconductor substrate is rotated on a plane with respect to the beam scanning surface by inclining at an angle of the semiconductor substrate surface and the plane perpendicular to the ion beam, or the angle of the semiconductor substrate surface and the plane perpendicular to the ion beam is inclined, and the rotation angle of the semiconductor substrate at every time in a total of n ion implantation is set at an integer multiple of about 360 degrees/n.

Consequently, the first conductive layer is successfully formed while maintaining a sufficient overlap Length between the gate electrode and the source/drain, and high performance and high reliability are achieved.

DETAILED DESCRIPTION OF THE INVENTION

Figure 1A:
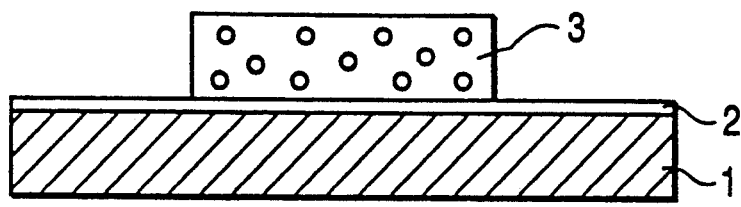
FIGS. 1(a)–(e) are process sectional views showing a manufacturing method of a conventional LDD structure MOS transistor.
Figure 1B:
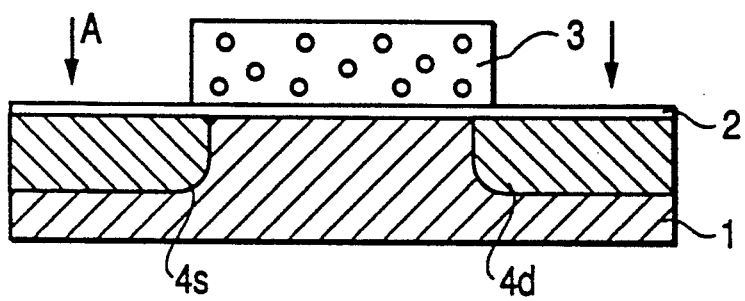
Figure 1C:
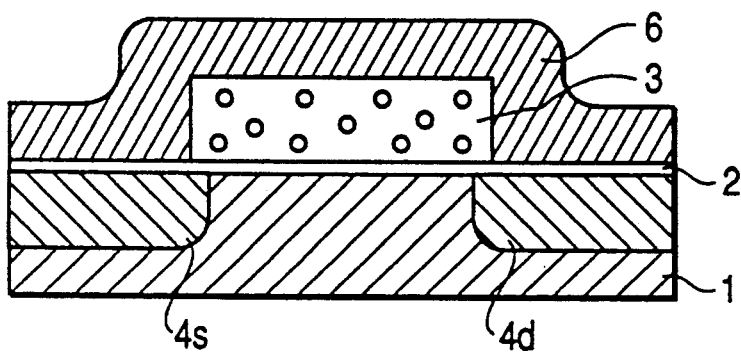
Figure 1D:
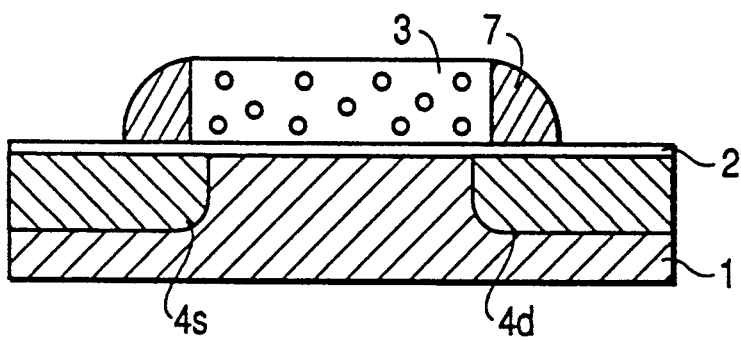
Figure 1E:
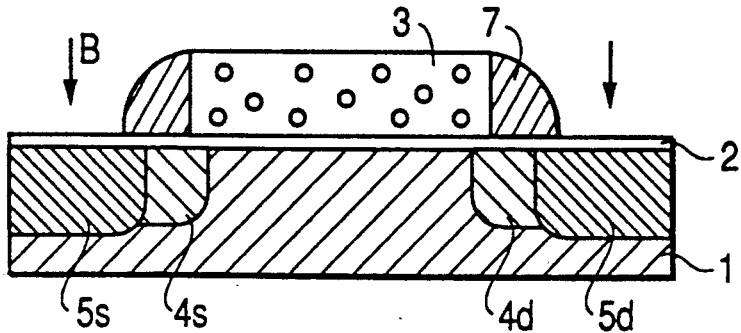
Figure 2A:
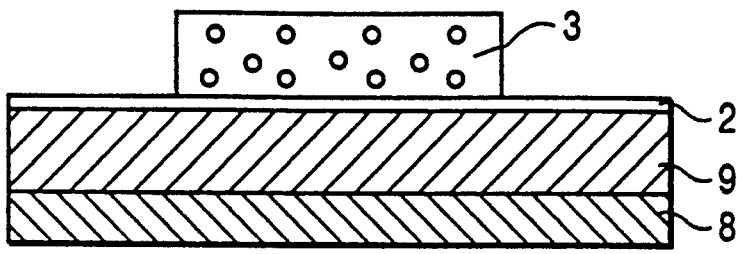
FIGS. 2(a)–2(e) are process sectional views showing a manufacturing method of a conventional EPS structure MOS transistor.
Figure 2B:
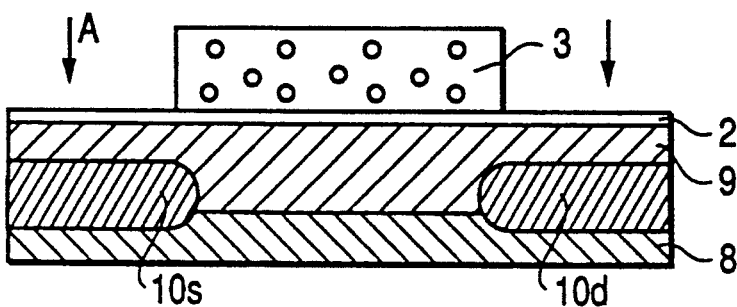
Figure 2C:
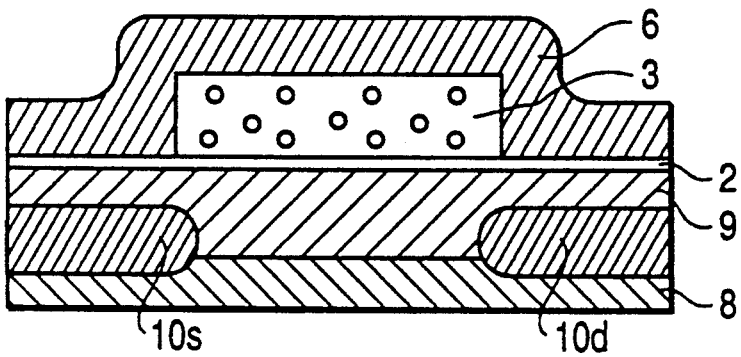
Figure 2D:
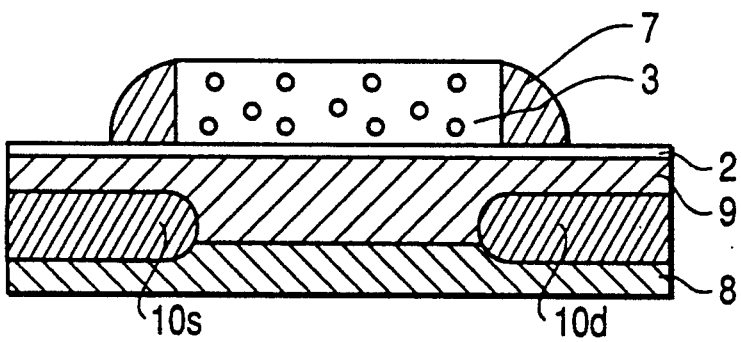
Figure 2E:
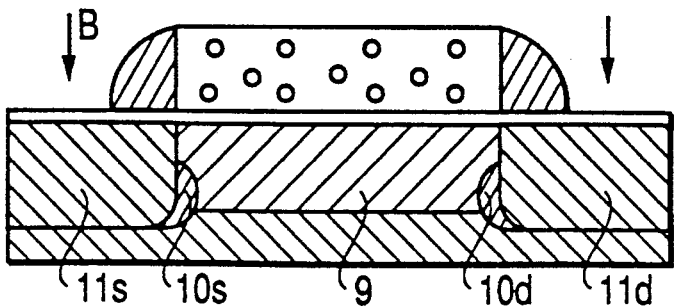
Figure 3A:
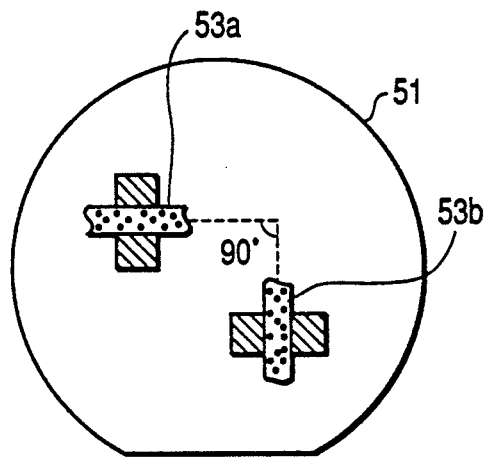
FIGS. 3A to 3E illustrate the ion implantation steps in this invention.
Figure 3B:
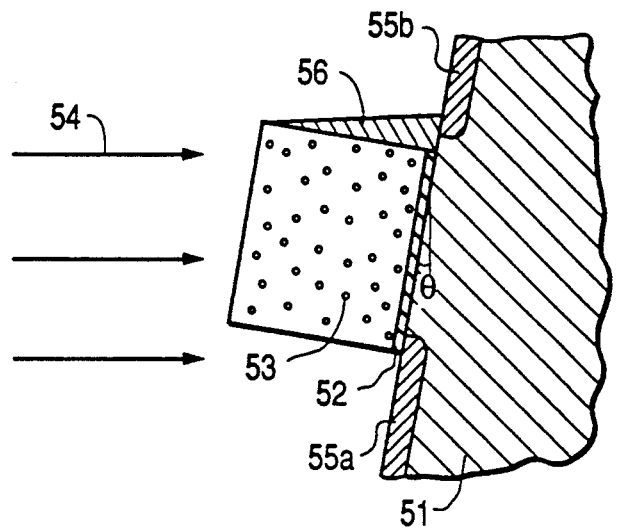
Figure 3C:
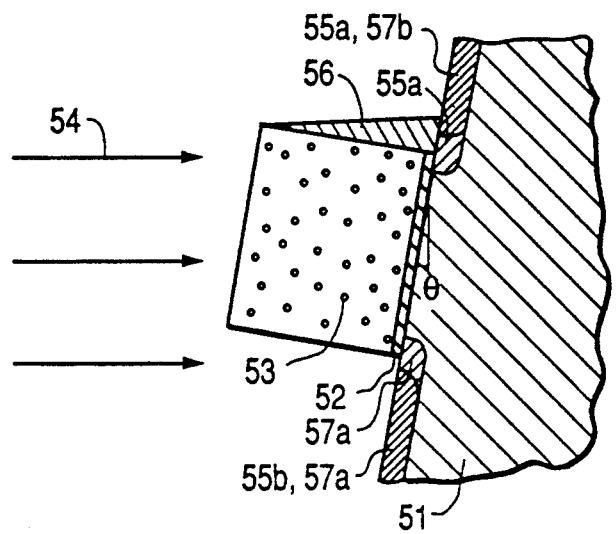
Figure 3D:
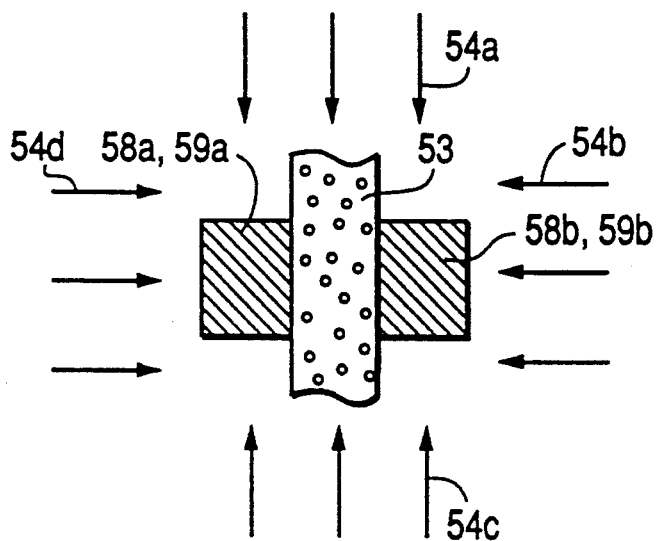

Firstly, as disclosed in Patent No. 4771012, an ion implantation method for avoiding the asymmetric effects is described below referring to FIGS. 3A to 3E. in the actual semiconductor integrated circuit, as shown in FIG. 3A, the gate electrode is designed, in most cases, so that 53a and 53b may orthogonally intersect with each other on the semiconductor substrate 51. That is, the gate of a MOS field effect transistor mostly runs in two directions. Therefore, in the conventional single ion implantation step, the shade or shadow of the gate electrode is inevitably formed. In view of this point, an object of the present invention is to form the impurity diffusion layer by the following ion implantation method. When forming an impurity diffusion layer by ion implantation using the gate electrode 53 as the mask on the semiconductor substrate 51 on which a gate insulation film 32 and a gate electrode 53 are formed, in order to prevent the channeling effect, the semiconductor substrate 51 is inclined by an angle $\theta$ (for example, 7 degrees) with respect to the normal of the ion beam incident direction 54, and ions are implanted. At this time, as shown in FIG. 3B, depending on the configuration of the gate electrode on the semiconductor substrate, a shade or shadow 56 of the gate electrode is formed, and the formed impurity diffusion layer (for example, the source and drain of the field effect transistor) becomes as indicated by regions 55a and 55b, and it is thus formed asymmetrically with respect to the gate electrode. However, in succession, when ion implantation is effected in the same conditions after a 180-degree plane rotation of the semiconductor substrate 51 with respect to the ion beam scanning plane, the impurity diffusion layer may be formed symmetrically with respect to the gate electrode, as shown in FIG. 3C, such as the region 55a and the region 55a and 57b, and the region 55b and the region 55b and 57a, so that a symmetry is obtained in the electric characteristics of the device. On the semiconductor integrated circuit, meanwhile, whatever the direction the gate electrode configuration may be, the problems of asymmetrical shape of individual transistors may be solved. Thus, by the second ion implantation, after the first step, by a 180-degree plane rotation of the semiconductor substrate with respect to the ion beam scanning plane, the asymmetrical shape of the impurity diffusion layer with respect to the gate electrode, at least, may be improved. At this time, the dose of each ion implantation is half of the total dose.

Figure 3E:
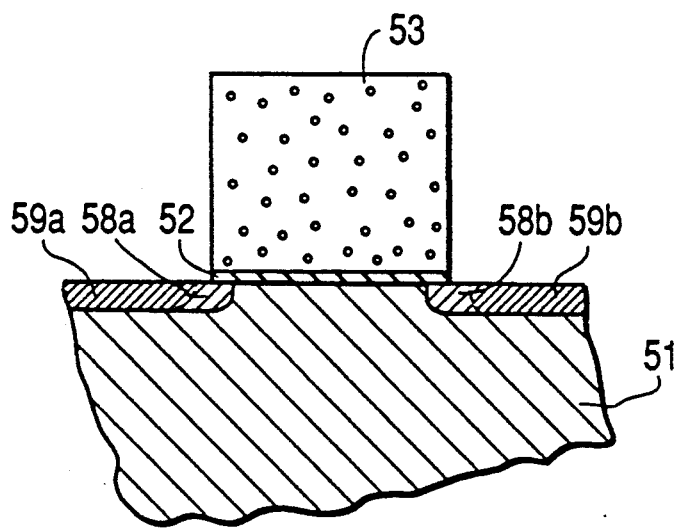

Furthermore, in a semiconductor integrated circuit, if it is necessary to adjust the electric characteristics of individual transistors strictly, the semiconductor substrate is placed, as shown in FIG. 5D, so that the ion beams may enter in the direction 54a parallel to the gate electrode 53 for the first ion implantation. Next, after a 90-degree plane rotation of the semiconductor substrate, a second ion implantation is effected from the direction 54b orthogonal to the gate electrode 53. Similarly, ions are implanted from directions 54c and 54d. That is, ions are implanted in a total of four steps by rotating the semiconductor substrate by 90 degrees each step. At this time, the dose of each implantation is one fourth of the total dose. As a result, two effects are obtained. First, while 55a and 57a of the impurity diffusion layer obtained by the two-rotation ion implantation in FIG. 3C is about half of the total dose, 58a and 58b of the impurity diffusion layer obtained by the four-rotation ion implantation in FIG. 3E is about three-fourths of the total dose, so that a diffusion layer closer to the desired impurity concentration may be obtained. Second, since the gate electrodes of the transistor are designed to be arranged orthogonally in a semiconductor integrated circuit as shown in FIG. 3A, 55a and 57a of the impurity diffusion layer obtained by the two-rotation ion implantation in FIG. 3C are not formed in the same shape if the gate electrode is arranged as 53a and 53b. That is, the asymmetricity of the diffusion layer is improved, but the shape of the diffusion layer in individual transistors cannot be uniformly adjusted, and the electric characteristics cannot be matched strictly. On the other hand, 58a and 58b of the impurity diffusion layer obtained by the four-rotation ion implantation in FIG 3E can be formed nearly in the same shape regardless of the gate electrode configuration, so that the electric characteristics of the transistors may be nearly matched.

Thus, by four-rotation ion implantation, not only the asymmetry of the impurity diffusion layer can be improved, but also a desired performance may be obtained in the electric characteristics of the transistor regardless of the gate electrode configuration.

Incidentally, the ion implantation method in this method is not limited to two or four implantations, and instead the ion implantation may be performed 2n times (where n is a positive integer). That is, in order to cancel the shade or shadow of the gate electrode, after at least one ion implantation, another ion implantation is effected by rotating the semiconductor substrate by 180 degrees. The angle of rotation may be arbitrary, but in order to match the electric characteristics of transistors in a semiconductor integrated circuit, particularly, 360 degrees/4m times (m is a positive integer) should be desired, and it is preferable that the gate electrode configuration of the transistor in the circuit design should also conform to this angle. Furthermore, when rotating the semiconductor substrate, it may also be possible to implant ions once while rotating the substrate continuously k times (k being a positive integer such as 1), but at this time, the rotation necessary for implanting a necessary dose, that is, the rotating speed of the semiconductor substrate when implanting ions, must be at least faster than one revolution per one implantation.

EMBODIMENT 1

Figure 4A:
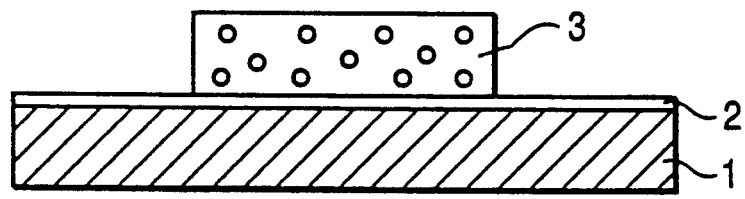
FIGS. 4(a)–4(c) are process sectional views showing a manufacturing method of MOS transistor in a first embodiment of the invention.
Figure 4B:
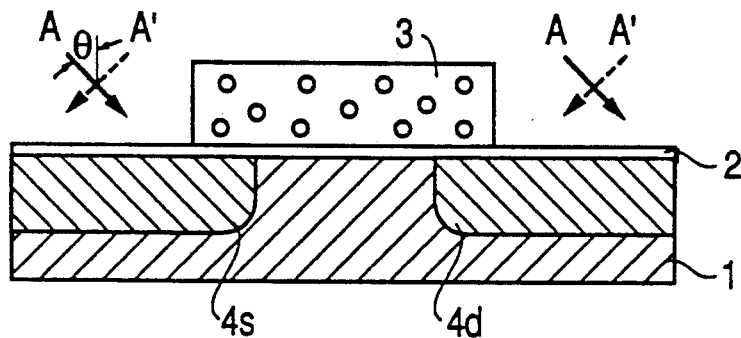
Figure 4C:
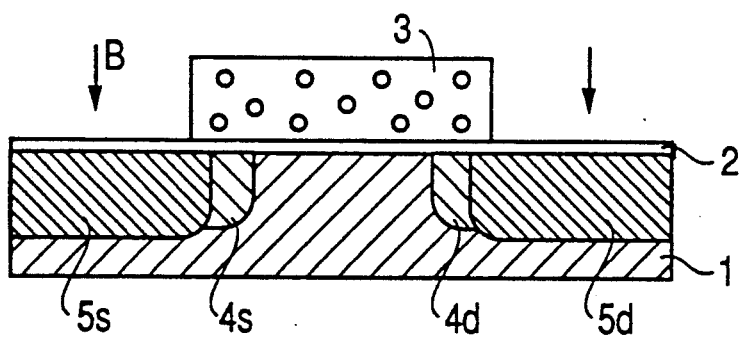

FIGS. 4(a)–4(c) are process sectional views showing the manufacturing method of n-channel MOS transitor in the first embodiment of the invention. Referring now to FIGS. 4(a)–4(e), the manufacturing period of an n-channel MOS transistor in the first embodiment of this invention is described below.

First, after forming a gate insulation film 2 on a p-type semiconductor substrate I (here p-type Si) surface, a polysilicon film is formed, and a gate electrode 3 is formed by anisotropic etching [FIG. 4 (a)]. Next, by ion implantation using the gate electrode 3 as the mask, first source region 4s and drain region 4d (implanting phosphorus as impurity to form n− layer) are formed as LDD regions [FIG. 4 (b)]. Here, so that the impurity may penetrate deeply beneath the gate insulation film 2, ions are implanted in a direction perpendicular to the surface of the semiconductor substrate 1, and at an angle $\theta$ of 20° to 45°. First, perpendicularly to the channel widthwise direction, and inclining so as to penetrate into the source direction in the channel lengthwise direction, the ions are implanted onto the surface of the semiconductor substrate 1 [the solid line arrow A in FIG. 4 (b)], and then implanted by inclining so as to penetrate into the other drain direction [the broken line arrow A′ in FIG. 4 (b)], so that a desired impurity ion implantation amount is achieved.

Subsequently, in the same manner as when forming the first source region 4s and drain region 4d, second source region 5s and drain region 5d (implanting arsenic as impurity to form n+ layer) are formed [FIG. 4 (c)]. Here, in order to reduce the amount of implanted impurities beneath the gate insulation film 2 and to prevent the channeling effect when implanting, the ion implantation angle is inclined 7° to the ion implantation direction in the direction perpendicular to the semiconductor surface, and ions are implanted so as to penetrate uniformly from both sides in the source and drain directions [the solid line arrow B in FIG. 4 (c)].

Thus, according to this embodiment, the LDD structure source 4s and drain region 4d can be formed without the sidewall forming step, and can also be formed on the entire surface beneath the gate electrode 3. Furthermore, by symmetrically forming the LDD structure source 4s and drain region 4d with respect to the gate electrode 3, electrically symmetrical and identical transistor characteristics may be obtained.

However, in the ion implantation B for forming the source 5s and drain region 5d, since the gate electrode 3 is used as the mask, the source 5s and drain region 5d are diffused during a long time of heat treatment in the resistance-heated furnace in a later process (for example, usually 900° to 950°, 30 minutes), and as a result the lateral diffusion length gate electrode 3 end (extention length of the source 5s and drain region 5d being toward beneath the gate electrode 3) is about 0.1 $\mu$m. Additionally, in order to alleviate the drain electrode field, practically, the widthwise direction length of n− layers 4s, 4d of about 0.1 $\mu$m is needed, and therefore it is necessary to perform the ion implantation A, A′ for forming the n− layers 4s, 4d under the condition in which the lateral length of n− layers 4s, 4d from the gate electrode 3 end may be about 0.2 $\mu$m. On the other hand, in order to enhance the operating speed of the MOS transistor, it is desired to minimize the overlap length of the gate electrode 3 and source regions 4s, 5s, and the gate electrode 3 and drain regions 4d, 5d, and the overlap length of 0.2 $\mu$m above is further desired to be smaller in the fine MOS transistor of which channel length is 1 $\mu$m or less. Thus, the lateral diffusion length of the n+ source/drain 5s, 5d should be reduced to be less than 0.05 $\mu$m by using reduced thermal processing, such as short-time annealing.

In this embodiment, in the heat treatment step after the ion implantation step for forming the n+ layers 5s, 5d, by activating the impurity in a lamp-heated rapid thermal annealing furnace for a short time (e.g. 1000° C., 10 seconds), the lateral diffusion length of the source 5s and drain region 5d from the gate electrode 3 end is limited to 0.05 $\mu$m, and as a result the overlap length of the gate electrode 3 and source regions 4s, 5s and the gate electrode 3 and drain regions 4d, 5d may be reduced to about 0.15 $\mu$m, so that it is expected to enhance the operating speed of the MOS transistor.

Figure 5:
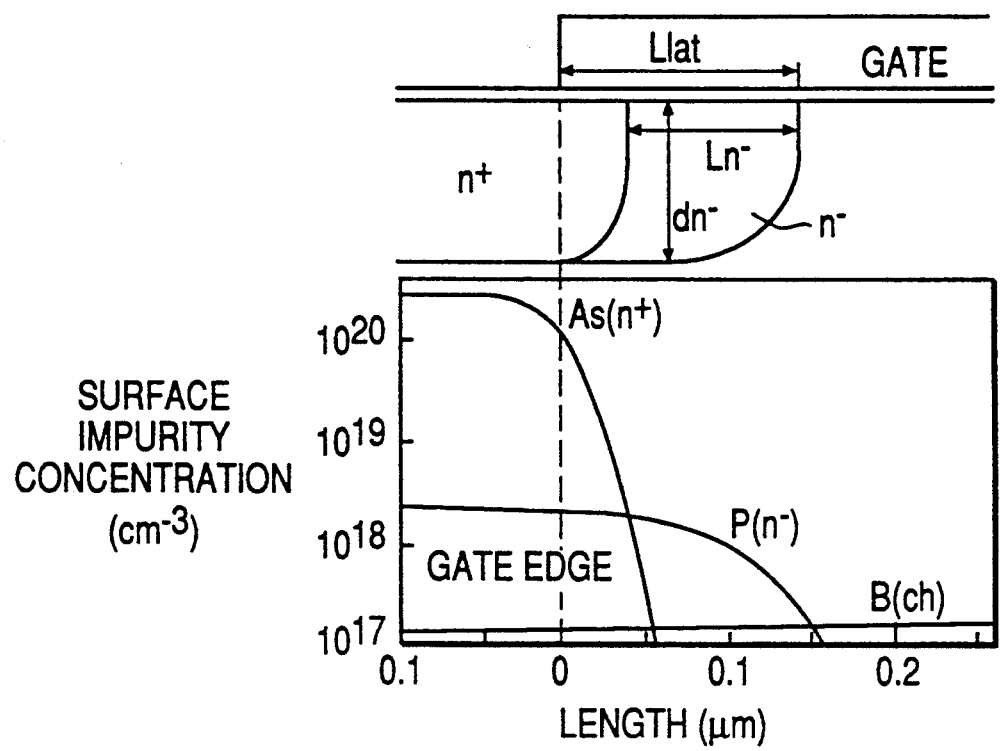
FIG. 5 shows a impurity concentration profile on the silicon substrate surface of the MOS transistor according to the calculation results in the first embodiment of the invention and its corresponding schematic sectional view.

FIG. 5 shows a calculation example of the impurity concentration profile in the vicinity of the silicon substrate surface after the short-time heat treatment step of the n-channel MOS transistor in the first embodiment of the invention. By the short-time heat treatment (1000° C., 10 seconds), it is known that the lateral diffusion length of the n+-layers 5s, 5d from the gate electrode 3 end is limited to about 0.05 $\mu$m. On the other hand, the conditions of ion implantation A, A′ for forming the n− layers 4s, 4d are the ion implantation angle of 45°, implantation energy of 80 keV, and dose of $4 \times 10^{13}$ cm$^{-2}$, and the lateral length of the n− layers 4s, 4d from the gate electrode 3 end, $L_{lat}$, is about 0.15 $\mu$m. As a result, it is known that the lateral length Ln− of the n− layers 4s, 4d of 0.1 $\mu$m or more is realized without using the sidewall which was indispensable in the formation of the conventional LDD structure.

Figure 6:
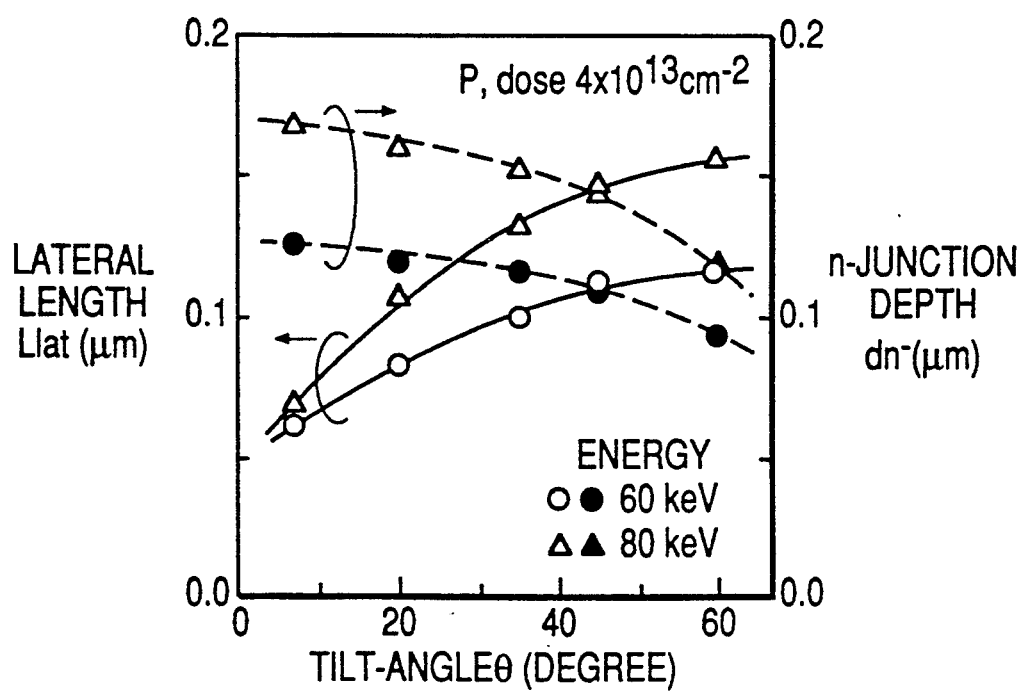
FIG. 6 is a diagram showing the dependence of the penetration distance of the n− layer from the ion implantation mask end on the ion implantation angle in the MOS transistor according to the calculation results of an embodiment of the invention.

FIG. 6 shows the dependence of the lateral length $L_{lat}$ of the n− layers 4s, 4d before heat treatment and the junction depth dn-on the ion implantation angle and energy. At each implantation energy, as the implantation angle $\theta$ increases, $L_{lat}$ increases very rapidly, and when the implantation angle $\theta$ exceeds 45°, it tends to be saturated. For example, at the implantation energy of 80 keV, when the implantation angle is 7° as is generally employed in the ordinary ion implantation step, $L_{lat}$ is about 0.07 $\mu$m, when it is 45°, it increases more than twice to about 0.15 $\mu$m. Such a capability of the large-tilt-angle ion implantation method is the reason that the LDD regions (n− layers) 4s, 4d with a sufficiently long $L_{lat}$ can be practically realized without the sidewall which is indispensable in formation of the conventional LDD structure. In a fine MOS transistor of which the channel length is less than 1 $\mu$m, in order to suppress the short channel effect, the junction depth of about 0.15 $\mu$m to 0.2 $\mu$m or less is desired. Accordingly, the implantation energy is limited to 80 to 100 keV or less. In the implantation energy range, the implantation angle $\theta$ should be $20° \leq \theta \leq 60°$ in order to obtain $L_{lat}$ longer than 0.1 $\mu$m according to FIG. 6. The increase of $L_{lat}$ with increasing the $\theta$ is saturated, and as a result, the value of $L_{lat}$ that can be actually achieved by the large-tilt-angle ion implantation is about less than 0.15 $\mu$m, and in order to realize a n− length of about 0.1 $\mu$m in this limited range, which is required to alleviate the drain electric field, it is known that heat treatment step for a short time in a heating oven is effective.

EMBODIMENT 2

FIGS. 7(a)-7(e) are process sectional views showing a manufacturing method of an n channel MOS transistor in a second embodiment of the invention. The MOS transistor in the second embodiment in FIG. 7 is, as compared with the MOS transistor in the first embodiment in FIG. 4, shortened in the overlap length of the end part of the gate electrode and high concentration source, and the end part of the drain region, and has an improved operating speed of the MOS transistor. According to FIG. 7, the manufacturing method of the n-channel MOS transistor in the second embodiment of the invention is described below.

The process is the same as in FIG. 4 from the step of forming a gate electrode 3 [FIG. 7 (a)] to the step of implanting ions by using the gate electrode 3 as a mask to form first source region 4s and drain region 4d as LDD regions [FIG. 7 (b)]. Then, a CVD-SiO$_2$ film 12 is formed [FIG. 7 (c)], and is anisotropically etched. The CVD-SiO$_2$ film 12 formed on the flat surface is removed, and a sidewall 13 made of CVD-SiO$_2$ film 12 is formed on the periphery of the gate electrode 3 [FIG. 7 (d)]. Afterwards, in order to form desired source and drain regions (n+ layers) 5s, 5d, the ion implantation B is effected as in FIG. 4 (c) by using the gate electrode 3 having sidewall 13 as a mask (FIG. 7 (e)]. The subsequent steps are the same as in FIG. 4.

The lateral width of the sidewall 13 is set smaller than the lateral diffusion distance of the n+ layers 5s, 5d from the mask end in ion implantation B (about 0.05 μm when heated for a short time in a heating oven, at 1000° C., for 10 seconds). Here, so that the whole region of the LDD regions (n− layers) 4s, 4d may come just beneath the gate electrode 3, the width of the sidewall 13 is defined to be 0.05 μm. On the other hand, the length of the n− layers 4s, 4d in FIG. 7 (e) is enough at about 0.1 μm to show a sufficient alleviating effect of the drain electric field, and therefore the ion implantations A, A' for forming the n− layers 4s, 4d may be selected so that the lateral length L$_{lat}$ of the n− layers 4s, 4d from the gate electrode 3 end may be 0.1 μm, and it is known from FIG. 6 that the selectable range of implantation condition is significantly widened as compared with the first embodiment. As a result, moreover, the overlap length of the gate electrode 3 and source regions 4s, 5s, and the gate electrode 3 and drain regions 4d, 5d is about 0.1 μm in this embodiment, which is much reduced from about 0.15 μm in the first embodiment without the sidewall 13, so that the operating speed of the MOS transistor is expected to be enhanced.

Meanwhile, as shown in FIG. 7 (e), since at least part of the second source and drain regions 5s, 5d is located just beneath the gate electrode 3, in other words, the n− regions 4s, 4d are entirely beneath the gate electrode 3, they cannot exist outside the gate electrode 3, structurally. Therefore, the pinchoff of the n− region outside the gate electrode 3 which is a defect in the conventional LDD structure MOS transistor is avoided, and the same improving effects as in the first embodiment are expected.

Next, is shown an example of experimental results of the MOS transistor manufactured according to the embodiment in FIG. 4. Here, in the P (phosphorus) ion implantation for forming n− layers 4s, 4d, the implantation angle, implantation energy and implantation dose are respectively 45°, 80 keV, 4×10$^{13}$ cm$^{-2}$, and the heat treatment after forming n+ layers 5s, 5d is 1000° C., 10 seconds.

As shown in the driving current-driving voltage characteristic of FIG. 3, in the conventional LDD structure MOS transistor having an identical channel length 0.5 μm (condition of ion implantation A: energy 40 keV, dose 1×10$^{13}$ cm$^{-2}$, sidewall 7 lateral film thickness 0.15 μm) the driving current is notably reduced particularily in a large gate-drive voltage, as compared with the single source/drain structure due to the increase of series resistance by pinchoff of the LDD [region (n− layer)] existing outside the gate electrode. On the other hand, in an embodiment of this invention, such a reduction is not observed, and an excellent driving current-drive voltage characteristic as in the single source/drain structure MOS transistor is shown.

Figure 9:
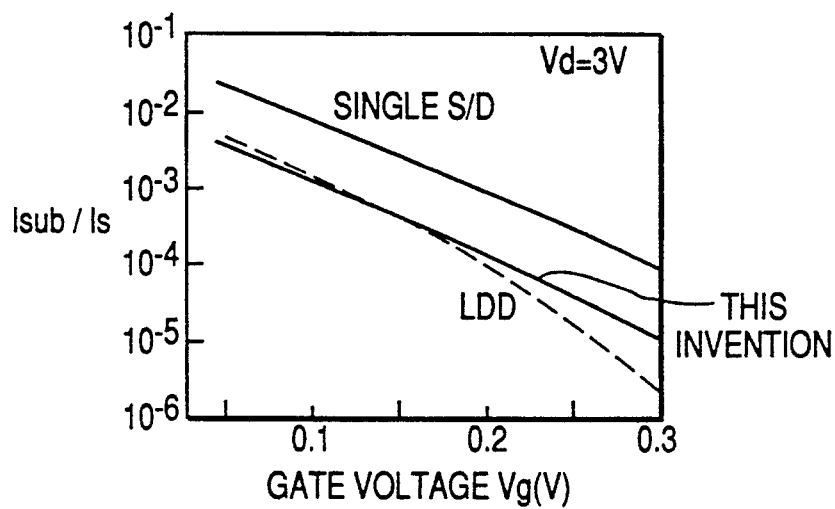
FIG. 9 is a diagram showing the ratio of substrate current/source current in the MOS transistors according to the experimental results of the prior art and of an embodiment of the invention.

In FIG. 9, on the other hand, the ratio of substrate current/source current in the channel length 0.5 μm is shown in comparison of the MOS transistors of the conventional single source/drain structure. The LDD structure and an embodiment of this invention. This ratio of substrate current/source current is useful for evaluation of the intensity of the drain electric field. As is clear from FIG. 9, the MOS transistor according to an embodiment of this invention is known to be notably alleviated in the drain electric field as compared with the single source/drain structure due to its n− layers 4s, 5s, being reduced to a level equal to the conventional LDD structure.

Figure 10:
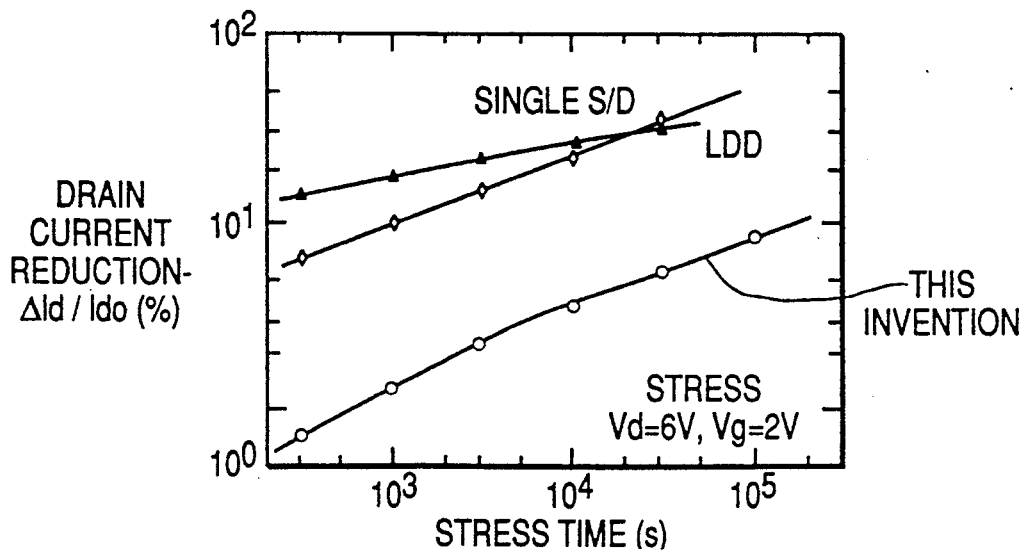
FIG. 10 is a drain current deterioration characteristic diagram by hot carrier of MOS transistors according to the experimental results of the prior art and of an embodiment of this invention.

By contrast, as is known from FIG. 10 showing the mode of deterioration of driving current by hot-carrier stressing, the MOS transistor according to an embodiment of this invention is found to be notably suppressed in the deterioration of device characteristics as compared with the conventional single source/drain structure and the LDD structure. Additionally, as compared with the single source/drain structure, the life to reach 10% deterioration of driving current is improved by about two digits, due to the lessening of the drain electric field by introducing the n− layers 4s, 5s shown in FIG. 9. On the other hand, as compared with the LDD structure, the life to reach 10% deterioration of driving current is improved by about three digits, due to the freedom from pinchoff because the n− layers 4s, 4d are located immediately beneath the gate electrode 3, unlike the LDD structure in which the n− layers 4s, 4d are outside the gate electrode 3.

Thus, according to the first and second embodiments, by symmetrically forming the n− layers 4a, 4d with respect to the gate electrode 3, identical transistor characteristics will be obtained in the MOS transistor. Furthermore, by the large-tilt-angle ion implantation method, the whole part of the LDD regions (n− layers) 4a, 4d can be formed just beneath the gate electrode 3, and as compared with the conventional single Source/drain structure and LDD structure MOS transistors, both a high performance and high reliability can be satisfied.

Meanwhile, the foregoing embodiments 1, 2 relate to the n-channel MOS transistors, but it is evident that the method of this invention may be equally applied to p-channel Mos transistors as well.

EMBODIMENT 3

Figure 11A:
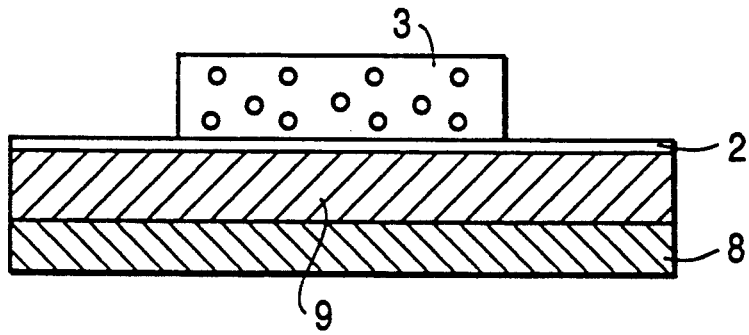
FIGS. 11(a)-11(c) are process sectional views showing a manufacturing method of MOS transistor in a third embodiment of the invention.
Figure 11B:
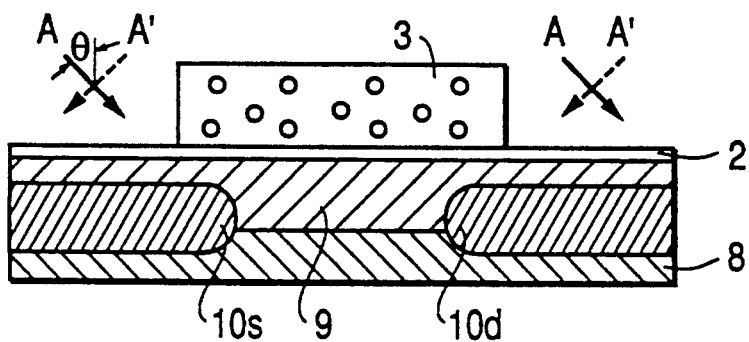
Figure 11C:
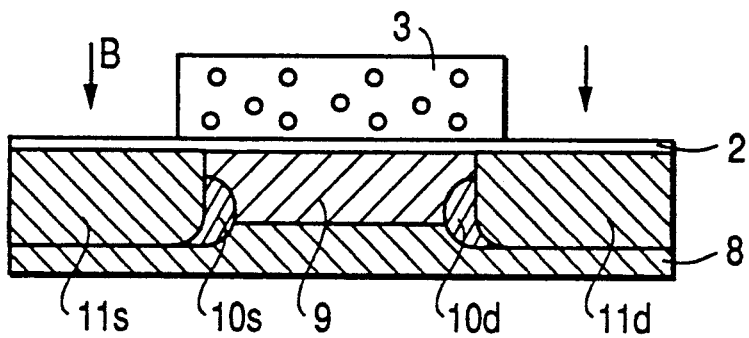
Figure 12A:
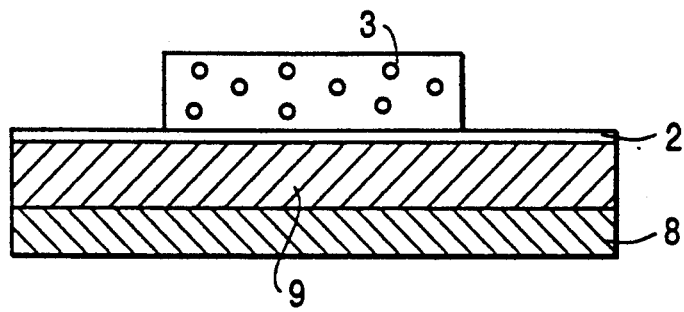
FIGS. 12(a)-12(e) are process sectional views showing a manufacturing method of MOS transistor in a fourth embodiment of the invention.
Figure 12B:
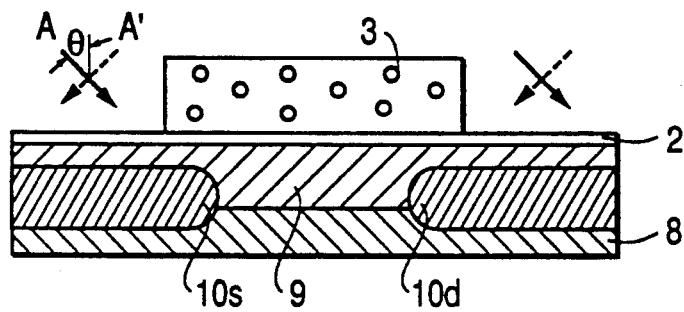
Figure 12C:
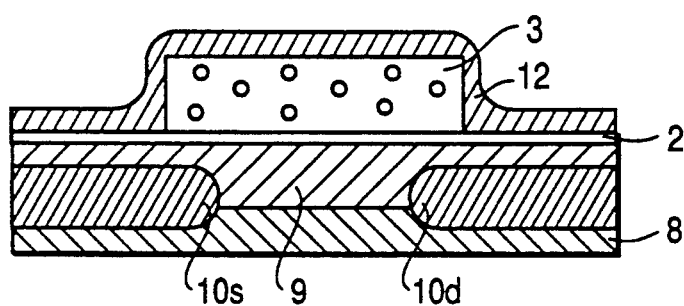
Figure 12D:
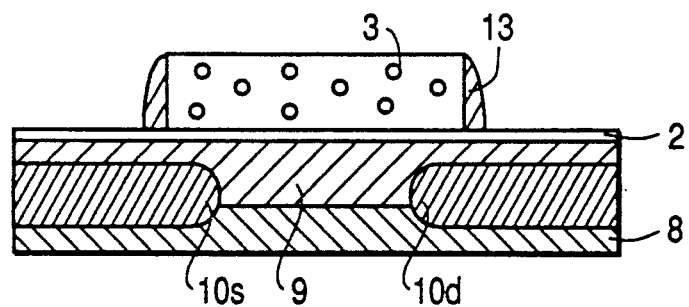
Figure 12E:
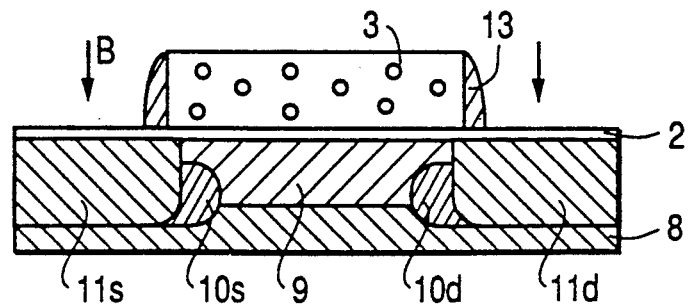

FIGS. 11(a)-11(c) are a process sectional views showing a manufacturing method of an MOS transistor in the third embodiment of this invention, and it relates to a p-channel MOS transistor. Referring to FIGS. 11(a)-11(c), the manufacturing method of the p-channel MOS transistor in the third embodiment of the invention is explained hereinafter.

To begin, after forming a p type impurity diffusion layer 9 as a buried channel in the transistor forming region on an n type semiconductor substrate or n well 3, a gate insulator film 2 is formed, a polysilicon film is deposited and etched, and a gate electrode 3 is formed [FIG. 11 (a)]. Next, in order to form, EPS regions (n+ layers) 10s, 10d, low concentrations ions are implanted using the gate electrode 3 as a mask, and n+ impurity layers 10s, 10d (phosphorus ions and implanted as impurity to form n+ layers) are formed [FIG. 11 (b)]. Here, in order so that the impurity may penetrate deep beneath the gate insulator 2, ions are implanted in the direction perpendicular to the semiconductor substrate surface and at an ion implantation angle $\theta$ of 20° to 45°. First, perpendicular to the channel widthwise direction and inclining so as to penetrate into the source direction in the channel lengthwise direction, the ions are implanted onto the semiconductor substrate surface the solid line arrow A in FIG. 11 (b)], and then inclining so as to penetrate into the other drain direction, ions are implanted the [broken line arrow A' in FIG. 11 (b)], and a desired quantity of impurity ion implantation is achieved [FIG. 11 (b)].

Next, in the same manner as the forming step of n+ regions 10s, 10d, source region 11s and drain region 11d (implanting BF$_2$ as impurity to form p+ layers) are formed [FIG. 11 (c)]. In order to decrease the amount of the implanted impurity beneath the gate insulator film 2 and to prevent the channeling effect at the time of implantation, the ion implantation angle is inclined 7° to the ion implantation direction in the direction perpendicular to the semiconductor surface, and the ions are implanted so as to penetrate uniformly from both sides in the source and drain directions the [solid line arrow B in FIG. 11 (c)].

Thus, according to this embodiment, the EPS regions (n+ layers) 10s, 10d can be formed beneath the buried channel region, closely adjacent to the P+ source and drain regions 11s, 11d, without the sidewall forming step. Furthermore, by forming the n+ regions 10s, 10d symmetrically to the gate electrode 3, identical transistor characteristics may be obtained the in MOS transistor.

Here, as explained above, when the junction depth of the n+ layers 10a, 10d is limited to be under 0.2 μm so as to be matched with the fine MOS transistor possessing a channel length of 1 μm or less in FIG. 6, the lateral length of the n+ layers 10s, 10d from the end of gate electrode 3 that can be achieved by the large-tilt-angle ion implantation method is limited to be approximately under 0.15 μm. In order to realize a practically effective lateral length of n+ layers 10s, 10d of over 0.05 μm in this limited range, it is indispensable to restrict the penetration of the P+ layers 11s, 11d from the end of the gate electrode 3. However, the B (boron) used as the impurity of P+ layers 11s, 11d has a large diffusion coefficient, and when heated in a resistance heating oven (e.g. 900° to 950° C., 30 minutes) which is widely used in the heat treatment step after ion implantation step of P+ layers 11s, 11d, the penetration of the P+ layers 11, 11d from the end of gate electrode 3 reaches as much as 0.2 to 0.25 μm, and as a result the EPS regions (n+ layers) 10s, 10d are compensated and annihilated by the p+ layers 11s, 11d. Thus the lateral diffusion length of the P+ source/drain 11s, 11d should be reduced to less than 0.1 μm by using reduced thermal processing, such as short-time annealing. In this embodiment, in the heat treatment step, heating is performed for a short time in a lamp-heated rapid thermal annealing furnace (e.g. 1000° C., 10 seconds). As a result, the penetration of the P+ layers 11s, 11d from the end of gate electrode 3 is decreased to 0.1 μm, so that the n+ layers 10s, 10d possessing a lateral width of about 0.06 μm are realized as shown in FIG. 11 (c). By this short-time heat treatment, the overlap length of the gate electrode 3 with source region 11s, and the gate electrode 3 with drain region 11d is decreased to 0.1 μm, becoming less than half, and the operating speed of the MOS transistor is expected to be increased. Additionally, the junction depth of the P+ source and drain regions 11s, 11d is also decreased to 0.2 μm, being about ½ to ¾ of the conventional long-time heat treatment in a resistance heating oven, so that it is very effective for inhibiting the punchthrough and short-channel effect.

EMBODIMENT 4

FIGS. 12(a)-12(e) are process sectional views showing a manufacturing method of MOS transistor in the fourth embodiment of the invention. The MOS transistor in the fourth embodiment shown in FIGS. 12(a)-12(e) further shortened in the overlap length between the end part of the gate electrode and the end part of the high concentration source and drain region, from the MOS transistor shown in the third embodiment in FIGS. 11(a)-11(c) and is therefore improved in the operating speed of the MOS transistor, and it is improved in order to improve the lateral distance longer in the EPS region (n+ layer). Referring now to FIGS. 12(a)-12(e) method of the p-channel MOS transistor in the fourth embodiment of the invention is described below.

The procedure is the same as in FIG. 11 from the step of forming a gate electrode 3 [FIG. 12 (a)], to the step of implanting ions using the gate electrode 3 as mask to form an n+ impurity layer in order to form EPS regions (n+ layers) 10s, 10d [FIG. 12 (b)]. Afterwards, forming a CVD-SiO$_2$ film 12 [FIG. 12 (c)])], the CVD-SiO$_2$ film 12 is anisotropically etched, and the CVD-SiO$_2$ film 12 formed on the flat surface is removed, and a sidewall 13 made of CVD-SiO$_2$ film 12 is formed on the periphery of the gate electrode 3 [FIG. 12 (d)]. Later, in order to form P+ layers 11s, 11d as source and drain regions, the same ion implantation B as in the case of FIG. 11 (c) is conducted using the gate electrode 3 possessing the sidewall 13 as a mask [FIG. 12 (e)]. The subsequent steps are the same as in FIG. 11.

The lateral width of the sidewall 13 is set smaller than the lateral diffusion length of P+ layers 11s, 11d from the mask end for ion implantation B (about 0.1 μm in the case of short-time heat treatment of 1000° C., 10 seconds), in consideration of the process fluctuations of the width of sidewall 13, so as to avoid elimination of the offset of the source and drain regions 11s, 11d, and the gate electrode 3. Here, since the width of the sidewall 13 is 0.05 μm, in the worst case considering ordinary process fluctuations, the overlap of the source and drain regions 11s, 11d and gate electrode 3 is maintained. Therefore, there is no risk of the defect of the EPS structure mentioned in the BACKGROUND OF THE INVENTION, that is, dislocation of the source and drain region outside the gate electrode 3 to cause pinchoff of the channel region formed outside the gate electrode 3, so that the same improving effects as in Embodiment 3 may be expected.

On the other hand, the overlap length of the gate electrode 3 and source region 11s, and the gate electrode 3 and drain region 11d is reduced to about 0.05 μm, half that of Embodiment 3, and for that portion it is expected that the operating speed of the MOS transistor is enhanced. Furthermore, when compared with the case without the sidewall as in Embodiment 3, the source and drain regions 11s, 11d are shifted parallel to the outside of the gate respectively by the portion of the width of sidewall 13 in FIG. 12. As a result, the lateral length of EPS regions (n+ layers) 10s, 10d of 0.11 μm, which is about twice that as compared with Embodiment 3, will be obtained. It is hence expected to improve the inhibitory effect of the elongation of the potential from the drain region 11d due to the high drain voltage.

Next is discussed an example of experimental results of an MOS transistor manufactured from the embodiment shown in FIG. 11. The implantation angle, implantation energy and implantation dose for implanting P (phoshorus) ions for forming n+ layers were respectively 25°, 90 keV, $2\times10^{13}$ cm$^{-2}$. The implantation energy and implantation dose for implanting BF$_2$ ions for forming the p+ source/drain were respectively 40 keV and $3\times10^{15}$ cm$^{-2}$, and the P+ layer junction depth after heat treatment of 1000° C., 10 seconds following the P+ layer formation was 0.2 μm. The implantation energy and implantation dose for implanting BF$_2$ ions for forming the buried channel 9 were respectively 50 keV and $1.7\times10^{12}$ cm$^{-2}$, and the depth of the buried channel after the above short-time heat treatment was about 0.17 μm. As a result, as shown in FIG. 11 (c), by large tilt angle ion implantation A, A', n+ high concentration impurity layers 10s, 10d were formed, including part of the lower part of the buried channel region 9, adjacent to the source and drain regions 11s, 11d, and the lateral length and maximum impurity concentration were realized at about 0.06 μm and about $1.5\times10^{17}$ cm$^{-3}$, respectively.

Figure 13A:
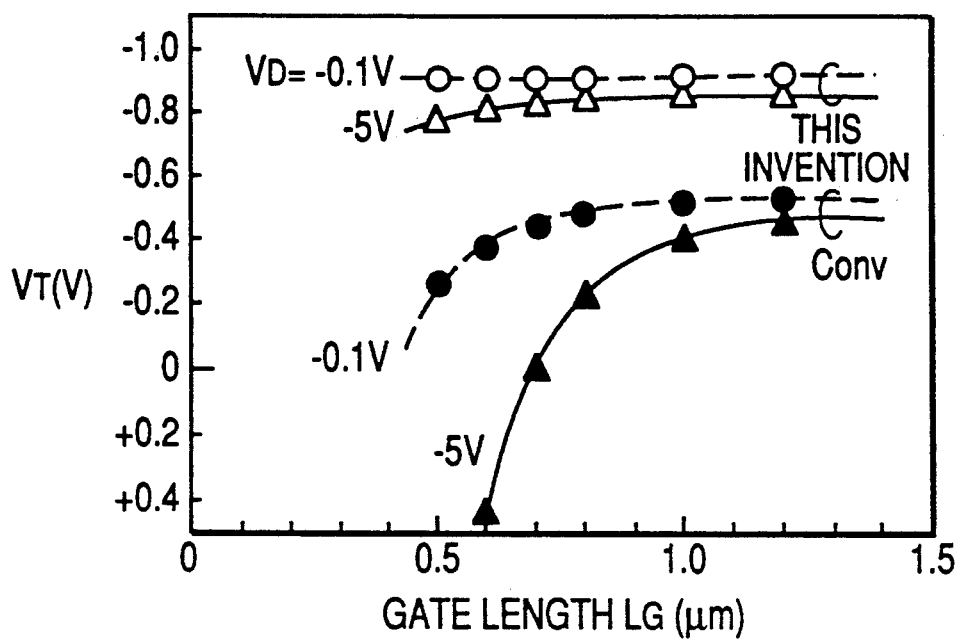
FIGS. 13(a)-13(b) diagram are showings the dependence of the threshold voltage and subthreshold swing on the gate length in the MOS-transistors according to the experimental results of the prior art and of an embodiment of the invention.
Figure 13B:
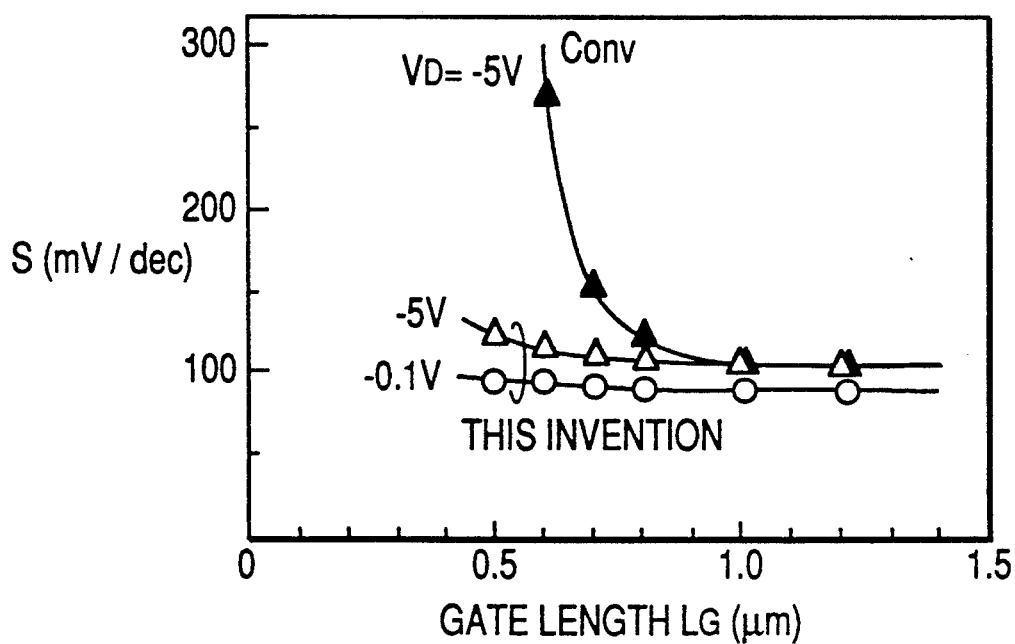

FIG. 13 (a), (b) show the dependence of the threshold voltage V$_T$ and subthreshold swing S on the gate length in the MOS transistors according to an embodiment of this invention and in a conventional structure. In the conventional structure, there is no ion implantation for forming n+ layer, and therefore n+ is not present, and the heat treatment after forming source/drain is set same as in the embodiment of this invention. Evidently, in the conventional structure, as the gate length became short, an obvious punch-through took place, and the minimum gate length for satisfactory device operation was about 1 μm. By contrast, in the MOS transistor according to the embodiment of this invention, even at the gate length of 0.5 μm (since the overlap of gate/source and gate/drain is 0.1 μm, the channel length at this time is 0.3 μm), the long-channel transistor characteristics are still maintained, and it is known that the punchthrough resistance is remarkably enhanced. For example, the threshold voltage lowering induced by increasing the drain voltage from −0.1 to −5V and the subthreshold swing, at a drain voltage of −5V are as small as 0.12V and 122 mV/decade, respectively, even when the effective channel length is as short as 0.3 μm. This is because the elongation of the potential from the drain region has been effectively suppressed by the presence of the EPS region (n+ layer) introduced by the large-tilt-angle implantation method.

Figure 14:
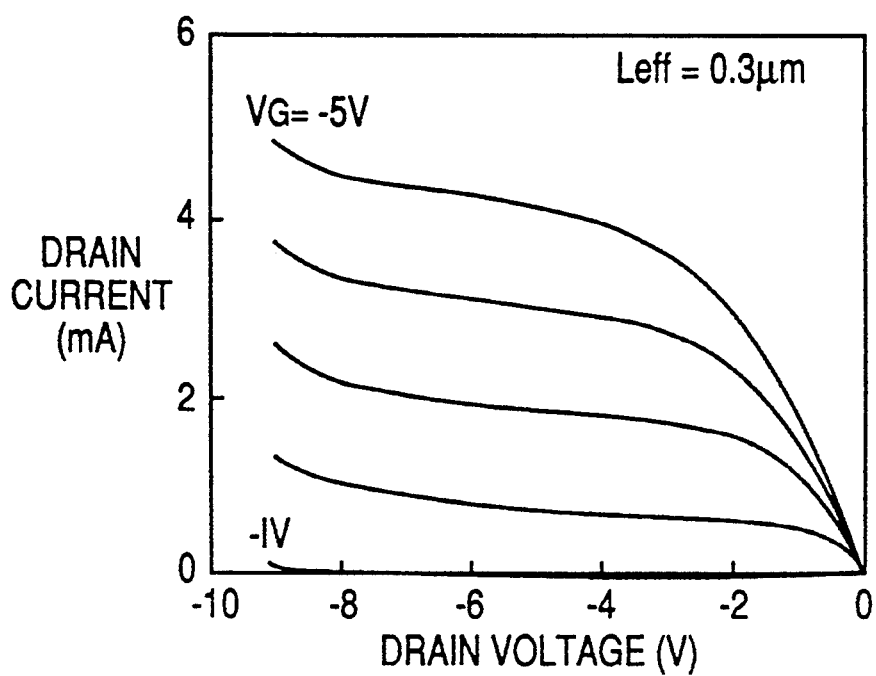
FIG. 14 is a saturated current characteristic diagram of the MOS transistor according to the experimental results in an embodiment of the invention.

FIG. 14 shows the saturation current characteristics of the MOS transistor in one of the embodiments of the invention having a channel length of 0.3 μm. If the channel length is as small as 0.3 μm, the same excellent long-channel characteristics are shown as represented by the small channel conductance in the saturation region. It is also known that a high transconductance of 135 mS/mm is obtained. By contrast, comparing at the same gate electrode length 0.5 μm as the conventional EPS structure MOS transistor having a thick sidewall, only a low transconductance is obtained because the channel of the EPS structure is as long as 0.5 μm. It is also known from FIG. 14 that the MOS transistor of the embodiment of this invention maintains a high drain-sustaining voltage of over 10V in spite of the small channel length of 0.3 μm and the presence of the n+ layer relatively high in concentration.

Thus, according to Embodiments 3 and 4, by forming the EPS regions (n+ layers) symmetrically to the gate electrode, the identical characteristics will be obtained in the MOS transistor. Furthermore, by the large-tilt-angle ion implantation method, it is possible to form EPS regions (n* layers) adjacent to the source and drain regions while keeping a sufficient overlap length of the gate electrode and p+ source and drain region, so that the high performance and high punchthrough resistance may be satisfied at the same time, as compared with the conventional single source/drain structure or EPS structure MOS transitor, and it is extremely useful practically.

The foregoing Embodiments 3 and 4 relate to p-channel MOS transistors, but the method of these embodiment may be, needless to say, equally applied to n-channel MOS transistors.

We claim:

1. A method of manufacturing an MOS transistor comprising:
   a step of forming a gate electrode on a gate insulation film formed on a surface of a semiconductor substrate, at least a surface adjacent portion of said semiconductor substrate being of a first conductivity type;
   a first ion implanting step for forming at least two buried regions of a second conductivity type in said semiconductor substrate using said gate electrode as a mask, a direction of said first ion implantation inclining at a predetermined angle equal to or larger than 20 degrees from a direction which is perpendicular to said surface, each of said buried regions extending partially beneath said gate electrode and being spaced apart along said surface:
   a second ion implanting step for forming source and drain regions of the first conductivity type in said semiconductor substrate using said gate electrode as a mask, a direction of said second ion implantation being substantially parallel to said perpendicular direction, wherein at least portions of said buried regions under said gate electrode remain;
   wherein, at least said first ion implantation is carried out under a condition such that said semiconductor substrate is rotated and said surface thereof maintained at said predetermined angle relative to said direction of said first ion implantation.

2. A method of manufacturing an MOS transistor as recited in claim 1, wherein said rotating of semiconductor substrate pauses at each 360/n degree rotation (n>2;n: integer) and said first ion implantation is carried out during each pause.

3. A method of manufacturing an MOS transistor as recited in claim 1, wherein said predetermined angle is within 20-60 degrees.

4. A method of manufacturing an MOS transistor as recited in claim 1, further comprising a step of heating the MOS transistor after said second ion implantation.

5. A method of manufacturing an MOS transistor as recited in claim 1, further comprising a step of forming thin insulation sidewalls at each side of said gate electrode before said second ion implantation, and width of said thin insulation sidewall being determined so as to minimize undesired an extension of said source and drain regions beneath said gate electrode while keeping an existence of said source and drain regions beneath said gate electrode.

6. A method of manufacturing an MOS transistor comprising:

a step of forming a gate electrode on a gate insulation film formed on a surface of a semiconductor substrate;

a first ion implanting step for forming first source and drain regions in said semiconductor substrate using said gate electrode as a mask, a direction of said first ion implantation inclining at a predetermined angle equal to or larger than 20 degrees from a direction which is perpendicular to said surface, said first source and drain regions extending partially beneath said gate electrode;

steps of forming an insulation film on said semiconductor substrate and said gate electrode, and partially removing said insulation film so as to form a gate electrode insulation film side wall; and a second ion implanting step for forming second source and drain regions in said semiconductor substrate using said gate electrode and said gate electrode insulation film side wall as a mask, a direction of said second ion implantation being substantially parallel to said perpendicular direction and having an implantation dose which is at least an order of magnitude more than that of said first ion implantation;

wherein, at least said first ion implantation is carried out under a condition such that said semiconductor substrate is rotated and said surface thereof is maintained at said predetermined angle relative to said direction of said first ion implantation, and a width of said insulation film side wall is set to minimize an undesired extension of said second source and drain regions beneath said gate electrode such that all remaining portions of said first source and drain regions are located beneath said gate electrode.

7. A method of manufacturing an MOS transistor as recited in claim 6, wherein said rotating of semiconductor substrate is made to pause at each 360/n degree rotation (n>2, n: integer) and said first ion implantation is carried out during each pause.

8. A method of manufacturing an MOS transistor as recited in claim 6, wherein said predetermined angle is within 20-60 degrees.

9. A method of manufacturing an MOS transistor as recited in claim 6, further comprising a step of heating the MOS transistor after said second ion implantation.

10. A method of manufacturing an MOS transistor comprising:

a step of forming a gate electrode on a gate insulation film formed on a surface of a semiconductor substrate, at least a surface adjacent portion of said semiconductor substrate being of a first conductivity type;

a first ion implanting step for forming at least two buried regions of a second conductivity type in said semiconductor substrate using said gate electrode as a mask, a direction of said first ion implantation inclining at a predetermined angle equal to or larger than 20 degrees from a direction which perpendicular to said surface, each of said buried regions extending partially beneath said gate electrode and being spaced apart along said surface;

a step of forming an insulation film on said semiconductor substrate and gate electrode, and partially removing said insulation film so as to form a gate electrode insulation film side wall;

a second ion implanting step for forming source and drain regions of a first conductivity type in said semiconductor substrate using said gate electrode and said gate electrode insulation film side wall as a mask, a direction of said second ion implantation being substantially parallel to said perpendicular direction, wherein at least portions of said buried regions under said gate electrode remain;

wherein, at least said first ion implantation is carried out under a condition in which said semiconductor substrate is rotated and said surface thereof is maintained at said predetermined angle relative to said direction of first ion implantation.

11. A method of manufacturing an MOS transistor as recited in claim 10, wherein said rotating of semiconductor substrate is made to pause at each 360/n degree rotation (n>2, n: integer) and said first ion implantation is carried out during each pause.

12. A method of manufacturing an MOS transistor as recited in claim 10, wherein said predetermined angle is within 20-60 degrees.

13. A method of manufacturing an MOS transistor as recited in claim 10, further comprising a step of heating the MOS transistor after second ion implantation.

* * * * *

UNITED STATES PATENT AND TRADEMARK OFFICE
CERTIFICATE OF CORRECTION

PATENT NO. : 5,270,226
DATED : December 14, 1993
INVENTOR(S) : Takashi HORI et al.

Figure 7A:
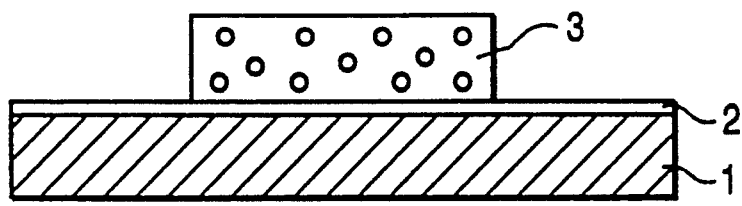
FIGS. 7(a)-7(e) are process sectional views showing a manufacturing method of MOS transistor in a second embodiment of the invention.
Figure 7B:
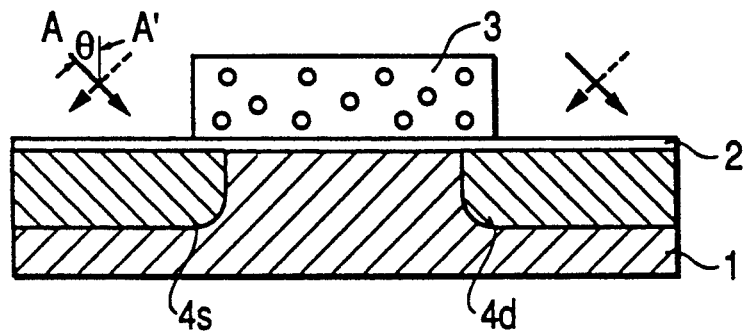
Figure 7C:
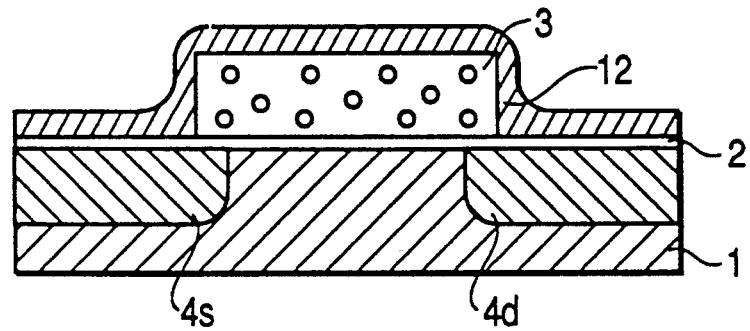
Figure 7D:
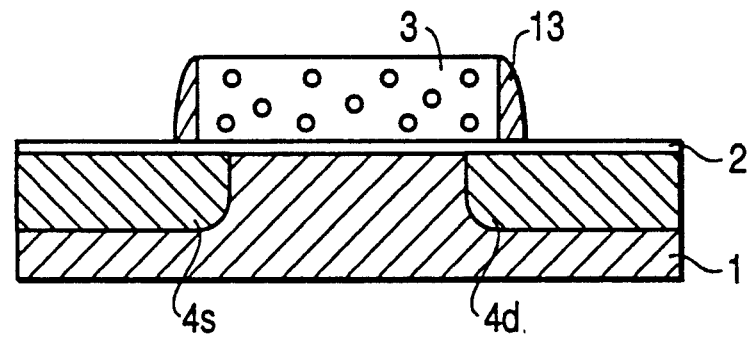
Figure 7E:
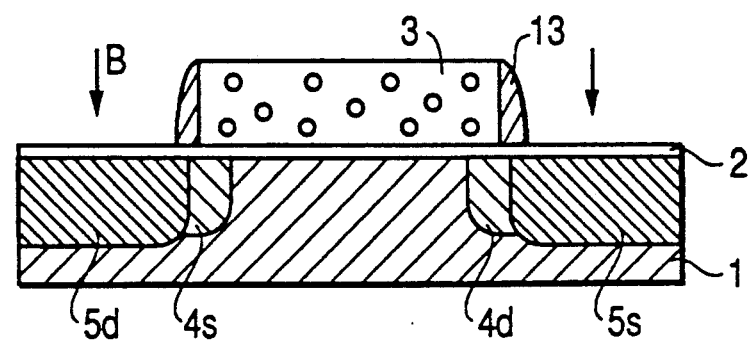
Figure 8:
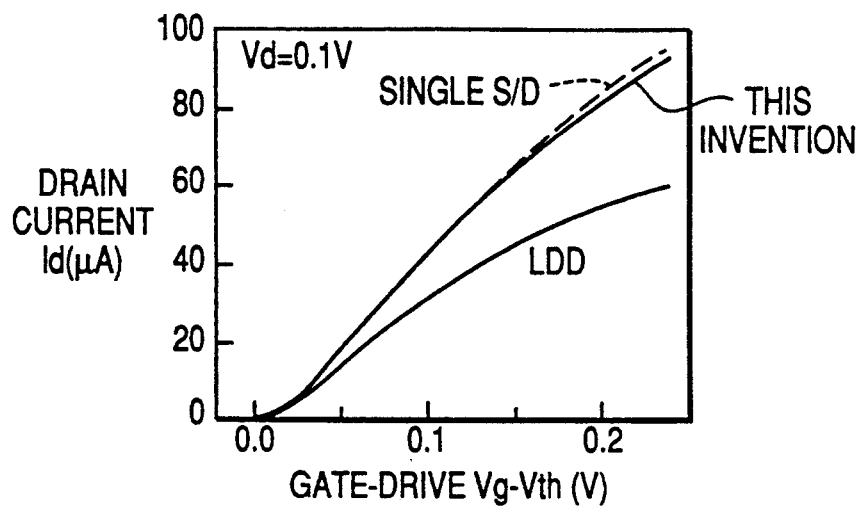
FIG. 8 is a driving current-driving voltage characteristic diagram according to the experimental results of MOS transistors of the prior art and of an embodiment of this invention.

It is certified that error appears in the above-indentified patent and that said Letters Patent is hereby corrected as shown below:

In the drawings, sheet 7, Fig. 7(e), the right edge of the drain region 5d should be aligned with the left side wall of the electrode 3, and the left edge of the source region 5s should be aligned with the right side wall of the electrode 3.

Signed and Sealed this

Eleventh Day of April, 1995

*Attest:*

BRUCE LEHMAN

*Attesting Officer*     *Commissioner of Patents and Trademarks*